United States Patent [19]

Kurihara

[11] 4,351,704
[45] Sep. 28, 1982

[54] PRODUCTION METHOD FOR SOLDER COATED CONDUCTOR WIRING

[75] Inventor: Keisuke Kurihara, Yokohama, Japan

[73] Assignee: Hitachi, Ltd., Tokyo, Japan

[21] Appl. No.: 235,575

[22] Filed: Feb. 18, 1981

[30] Foreign Application Priority Data

Feb. 20, 1980 [JP] Japan .................................. 55-19207

[51] Int. Cl.³ .......................... C25D 5/02; C25D 5/10; C25D 5/50
[52] U.S. Cl. ..................... 204/15; 204/37 T; 204/38 B
[58] Field of Search ...................... 204/15, 37 T, 38 B

[56] References Cited

U.S. PATENT DOCUMENTS 3,528,892 9/1970 Mazur ..................................... 204/15
3,742,597 7/1973 Davis ................................... 204/37 T

FOREIGN PATENT DOCUMENTS 730090 5/1955 United Kingdom .............. 204/37 T

Primary Examiner—T. M. Tufariello
Attorney, Agent, or Firm—Antonelli, Terry & Wands

[57] ABSTRACT

A method of production of solder coated conductor wiring wherein a lead layer and a tin layer are separately applied to the surface of a ceramic substrate in superposed relation, and subjected to heat treatment at a temperature suitable for alloying the lead and tin into a lead-tin alloy, to provide the solder coated conductor wiring.

10 Claims, 9 Drawing Figures

PRODUCTION METHOD FOR SOLDER COATED CONDUCTOR WIRING

BACKGROUND OF THE INVENTION

1. Field of the Invention

This invention relates to a method of production of solder coated conductor wiring wherein the solder coated conductor wiring is provided on a ceramic substrate.

2. Description of the Prior Art

In one method known in the art of production of solder coated conductor wiring, an Ag-Pd paste is applied to a ceramic substrate and formed into Ag-Pd conductor wiring by printing, drying and firing, and then the substrate is immersed in a molten solder to produce the solder coated conductor wiring. In another method known in the art, a ceramic substrate is formed thereon with a metal layer by thin filming techniques, and the thin metal film is formed thereon with conductors as by plating before having a coat of solder applied by plating to the conductors to provide the solder coated conductor wiring.

Some disadvantages are associated with the aforesaid methods of production of solder coated conductor wiring of the prior art. For one thing, the use of a molten solder produces a coat of solder of about 20 $\mu$m in thickness, and the trouble of short-circuiting of the conductors would occur in the case of miniature wiring when the conductors have a spacing interval of less than 20 $\mu$m. For another, when plating is relied on for applying a solder, difficulties would be experienced in adjusting the composition of the solder, making it difficult to form a solder coat of high corrosion resistance. Also, when electric parts are soldered together, the connections formed would tend to be poor in reliability.

SUMMARY OF THE INVENTION

This invention has been developed for the purpose of obviating the aforesaid disadvantages of the prior art. Accordingly, the invention has as its object the provision of a method of production of solder coated conductor wiring enabling a solder coat to be applied in cases where the conductors of the wiring have a spacing interval of less than 20 $\mu$m and permitting the composition of the solder to be readily adjusted as desired.

To accomplish the aforesaid object, the invention provides the feature that a lead layer and a tin layer are formed separately superposed relation on a conductive metal, such as copper, applied to a ceramic substrate and then the layers of lead and tin are subjected to heat treatment at a temperature suitable for alloying the lead and tin to produce a lead-tin solder. More specifically, a thin metal film selected from the group consisting of chromium, nichrome and titanium is applied to a ceramic substrate by vacuum deposition or sputtering to facilitate bonding of copper to the ceramic substrate with high bonding strength, and then the thin copper film is applied to the thin metal film by vacuum deposition or sputtering. A photo-resist is applied to the surface of the thin copper film and developed to remove the photo-resist from the portions of the thin copper film which represent conductors of the wiring to expose the copper of these portions. An additional copper layer is formed on the exposed portions of thin copper film by electroplating so that the copper layer becomes integral with the thin copper film. Following a lead layer and a tin layer are formed separately superposed relation by electroplating on the copper layer, the residual photo-resist is removed and then the thin copper film and one of the thin chromium film, thin nichrome film and thin titanium film underlying the photo-resist is removed by etching. Thereafter, the lead layer and the tin layer are subjected to heat treatment at a suitable temperature for converting the lead and tin into an alloy to produce a lead-tin solder.

The materials used in the invention are as follows. The ceramic substrate may be in the form of an alumina substrate, beryllia substrate, steatite substrate or forsterite substrate. The photo-resist may be either positive or negative. When the photo-resist is negative, a photo-resist produced by Tokyo Oka Kogyo Company, Ltd. (OMR-83) or Eastman Kodak Company (KMR-747) may be used. For removing the residual photo-resist, S-502 produced by Tokyo Oka Kogyo Company, Ltd. is used when the photo-resist is OMR-83 or KMR-747.

The metal coats are formed on the ceramic substrate as follows. Firstly, a thin metal film selected from the group consisting of chromium, nichrome and titanium is applied by vacuum deposition or sputtering. Then a thin copper film is applied also by vacuum deposition or sputtering. The conditions for forming these coats are as stated in paragraphs (f) and (g):

| (f) Conditions of Vacuum Deposition | |
|---|---|
| Temperature of Substrate | Room Temperature (18° C., for example) to 250° C. |
| Vacuum | $1 \times 10^{-5}$ to $1 \times 10^{-8}$ Torr. |
| Speed of Deposition | 5 to 80 Å/sec. |
| (g) Conditions of Sputtering | |
| Temperature of Substrate | R.T. (18° C., for example) to 200° C. |
| Vacuum | $1 \times 10^{-5}$ to $1 \times 10^{-8}$ Torr. |
| Gas Pressure | 1 to 8 mm Torr. |
| Target | 99.999% Cr, 99.999% Cu, 99.999% Ti or Nichrome. |
| Power | 1.5 to 2.5 KW. |
| Current | 2 to 6 A. |

When an electroplated copper layer is formed on the thin copper film, electroplating is relied on. The plating conditions are as follows.

| (h) Copper Plating Conditions | | |
|---|---|---|
| Plating Solution | CuSO$_4$.5H$_2$O | 50 to 90 g. |
| | Conc. H$_2$SO$_4$ | 100 g. |
| | HCl | 0.05 to 1.5 ml. |
| | Water | Volume enough to solve the above compounds to obtain a solution of 1 liter. |
| Density of Current | | 1.2 to 1.7 A/dm$^2$. |
| Temperature of Plating Solution | | R.T. (18° C., for example) to 60° C. |

The plating conditions for forming the lead layer and the tin layer by electric plating are as stated in paragraphs (i) and (j) below respectively.

| (i) Conditions of Lead Plating | | |
|---|---|---|
| Plating Solution | (PbCO$_3$)$_2$.Pb(OH)$_2$ | 15–25 ml. |
| | NH$_2$SO$_3$H | 80–120 g. |
| | Gelatin | 3–7 g. |
| | NaOH | Volume enough to render pH 2.5–3. |
| | Water | Volume enough solve the above compounds to obtain |

-continued

| | | |
|---|---|---|
| | | a solution of 1 liter. |
| Density of Current | 0.8 to 1.2 A/dm². | |
| Temperature of Plating Solution | R.T. (17° C., for example) to 60° C. | |

(j) Conditions of Tin Plating

| | | |
|---|---|---|
| Plating Solution | SnSO₄ | 1.5-25 ml. |
| | NH₂SO₃H | 100-160 g. |
| | Tartaric Acid | 12-18 g. |
| | Polyethylene Glycol | Trace. |
| | Water | Volume enough to solve the above compounds to obtain a solution of 1 liter. |
| Density of Current | 0.8 to 1.2 A/dm². | |
| Temperature of Plating Solution | R.T. (17° C., for example) to 60° C. | |

Removal of the copper film (the electroplated copper layer is integrated with the thin copper film) and the thin chromium film by etching is carried out under the following conditions (k) and (l).

(k) Copper Coat Etching Conditions

| | | |
|---|---|---|
| Etching Solution | Conc. H₂SO₄ | 80-120 g. |
| | 30% H₂O₂ | 25-35 ml. |
| | Water | Volume enough to solve the above compounds to obtain a solution of 1 liter. |
| Temperature of Etching Solution | R.T. (18° C., for example) to 50° C. | |

(l) Chromium Coat Etching Conditions

| | | |
|---|---|---|
| Etching Solution | Potassium Ferricyanide | 25-35 g. |
| | KOH | 3-7 g. |
| | Water | Volume enough to solve the above compounds to obtain a solution of 1 liter. |
| Temperature of Etching Solution | R.T. (18° C., for example) to 50° C. | |

To enable the thin chromium film to be bonded to both the ceramic substrate and the thin copper film with high bonding strength, the thin chromium film preferably has a thickness in the range between 500 and 2500 Å. The thickness of the thin copper film applied to the thin chromium film is preferably in the range between 0.2 and 2 μm which shows good conductivity when electric plating is applied. The thickness of the copper layer formed on the thin copper film may vary depending on the conductivity desired. Usually the thickness is in the range between 2 and 10 μm and may be 20 μm. The thickness in the range between 1.2 and 4.8 μm and a thickness in the range between 2 and 8 μm are enough for the lead layer and the tin layer respectively.

The lead layer and the tin layer are subjected to heat treatment at a temperature suitable for converting the lead and tin into a lead-tin solder. When the lead layer and the tin layer of the aforesaid thickness ranges are subjected to heat treatment, solders of compositions ranging from Pb:Sn=8:2 (M.P., 275° C.) to Pb:Sn=2:8 (M.P., 200° C.) are produced. The desired range as an alloy is between Pb:Sn=6:4 (M.P., 230° C.; having the best corrosion resistance) and Pb:Sn=3:7 (M.P., 191° C.), and the most desired range is between Pb:Sn=4:6 and Pb:Sn=5:5 (M.P., 210° C.). When lead is higher in proportion than the composition Pb:Sn=8:2, the solder becomes too soft to be effective; and when lead is lower in proportion than the composition Pb:Sn=2:8, the solder becomes too hard and brittle. Thus the lead layer and the tin layer are subjected to heat treatment at a temperature in the range between 100° and 350° C., preferably in the range between 200° and 350° C., at which the lead and tin are converted into an alloy to provide a lead-tin solder. When the temperature is below 100° C., alloying is delayed and undesirable. When it is above 350° C., alloying can be achieved. However, in view of the need to connect with one another integrated circuits and other electrical elements by soldering, the upper limit of the temperature range is set at 350° C.

DESCRIPTION OF THE PREFERRED EMBODIMENT

Figure 1:
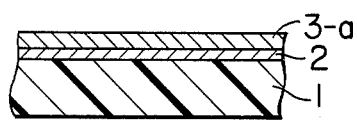
FIGS. 1–9 show the process steps followed in producing solder coated conductor wiring according to the invention.

The invention will now be described by referring to the embodiment shown in the drawings, wherein the numerals 1, 2, 3, 3-a, 3-b, 4-a, 4-b, 5, 6 and 7 designate a ceramic substrate, the thin chromium film, the copper film, a thin copper film, an electroplated copper layer, a photo-resist film, a developed photo-resist film, a lead layer, a tin layer and a solder layer, respectively.

As shown in FIG. 1, to enable the copper layer 3 to be bonded to the ceramic substrate 1 of alumina with high bonding force, the thin chromium film 2 of 0.1 μm thick is applied to the ceramic substrate 1 by using 99.999% chromium as a target by vacuum deposition under the conditions including the temperature of the substrate of 200° C., the vacuum of $2 \times 10^{-6}$ Torr and the speed of deposition of 8 Å/sec. And the thin copper film 3-a of 0.5 μm thick which serves as a first film for copper plating is applied to the thin chromium film 2 by vacuum deposition under the same conditions as vacuum deposition of the thin chromium film 2 except that 99.999% copper is used in place of 99.999% chromium as a target.

Figure 2:
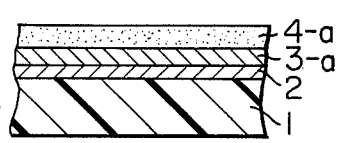

As shown in FIG. 2, the photo-resist film 4-a is applied by means of a spinner coating to the surface of the thin copper film 3-a (the photo-resist used is of the negative type or OMR 83 produced by Tokyo Oka Kogyo Company, Ltd. having a viscosity of 100 cp).

Figure 3:
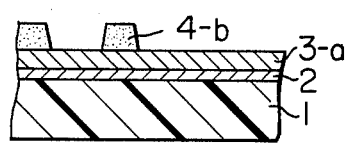

The photo-resist film 4-a is exposed after a mask of the desired wiring pattern is placed thereon, and the exposed photo-resist film 4-a is processed through developing and washing with a rinse to remove the unexposed portions of the photo-resist film 4-a while leaving the exposed and developed portions thereof as the developed photo-resist film 4-b as shown in FIG. 3.

Figure 4:
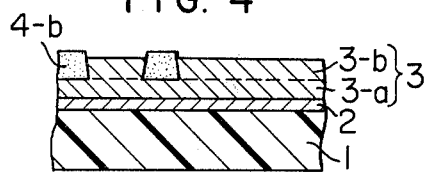

As shown in FIG. 4, the electroplated copper layer 3-b which constitute the conductors of the wiring of 6 μm thick is applied to the surface of the thin copper film 3-a which is exposed as the result of removal of the photo-resist film 4-a. The plating conditions are as follows: the plating solution contains 65 g of CuSO₄.5H₂O, 95 g of conc. H₂SO₄, 0.1 ml of HCl, and water of a volume enough to solve the above compounds and obtain a solution of 1 liter; the temperature of plating solution is 40° C.; and the density of current is 1.3 A/dm². The electroplated copper layer 3-b and the thin copper film 3-a are integrally formed into the copper film 3.

Figure 5:
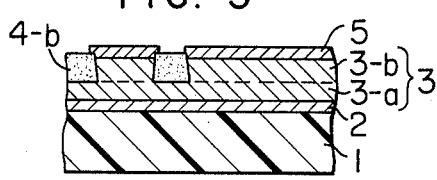

As shown in FIG. 5, the lead layer 5 of 2.4 μm thick is applied to the electroplated copper layer 3-b by electroplating. The plating conditions are as follows: the plating solution contains 18 ml of $(PbCO_3)_2Pb(OH)_2$, 95 g of $NH_2SO_3H$, 4 g of gelatin, and water of a volume enough to solve the above compounds and obtain a plating solution of 1 liter; the temperature of plating solution is 35° C.; and the density of current is 0.8 A/dm².

Figure 6:
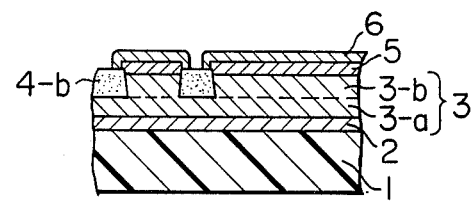

As shown in FIG. 6, the tin layer 6 of 6 μm thick is applied to the lead layer 5 by electroplating. The plating conditions are as follows: the plating solution contains 18 g of $SnSO_4$, 125 g of $NH_2SO_3H$, 14 g of tartaric acid, a trace of polyethylene glycol and water of a volume enough to solve the above compounds and obtain a plating solution of 1 liter; the temperature of plating solution is 35° C.; and the density of electric current is 0.8 A/dm². The invention is achieved, when the lead layer 5 and the tin layer 6 are both formed on the electroplated copper surface.

Figure 7:
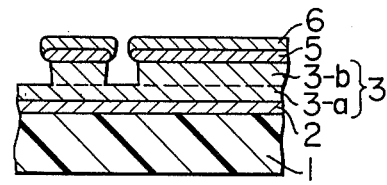
Figure 8:
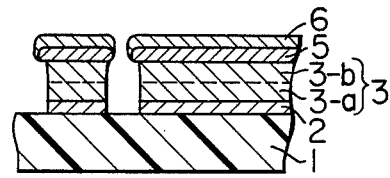

As shown FIG. 7, the developed photo-resist film 4-b is removed by the photo-resist removing agent (S-502 produced by Tokyo Oka Kogyo Company, Ltd.) by treating for 8 minutes at 150° C. Then etching substrate washed by rinsing liquid to remove the photo-resist removing agent. As shown FIG. 8, the copper coat 3-a is removed by etching. The etching solution used contains 90 g of conc. $H_2SO_4$, 28 ml of 30% $H_2O_2$ and water of a volume enough to solve the above compounds and obtain an etching solution of 1 liter and is heated to 30° C. Then, the thin chromium film 2 is removed by etching, the etching solution containing 28 g of potassium ferricyanide, 4 g of KOH and water of a volume enough to solve the above compounds and obtain an etching solution of 1 liter.

Figure 9:
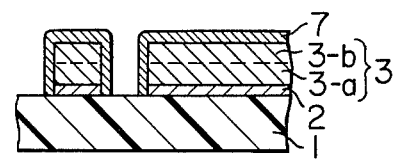

As shown in FIG. 9, by heating for 10 minutes at 300° C., the lead layer 5 and the tin layer 6 are changed into an alloy to provide the solder layer 7 of lead:tin=4:6.

The conductors obtained in this way had a resistance of 3–5 m $\Omega/\square$. The resistance varied only less than 5% of the original value when aging for 150 hours at 150° C.

The thin chromium film 2 in the all figures may be replaced by the thin nichrome film or the thin titanium film. The thickness is in the range between 500 and 2500 Å. The tin layer and the lead layer may be applied to the copper layer 3 in the indicated order to form a tin-lead alloy solder by heat treatment under the same conditions as described hereinabove.

In this application and accompanying drawings there is shown and described a preferred embodiment of the invention and suggested various alternatives thereof, but it is to be understood that these are not intended to be exhaustive and that other changes and modifications can be made within the scope of the invention.

For example, the cases of the thickness about the photo-resist film is thinner than that of electroplated copper layer (3-b) and the former and the latter are the same thickness are made within the invention instead of the case of the drawings.

What is claimed is:

1. A production method for solder coated conductor wiring comprising the following steps (a) through (g):
   (a) a thin metal film selected from the group consisting of chromium, nichrome and titanium is formed on a ceramic substrate by vacuum deposition or sputtering,
   (b) a thin copper film is formed on said thin metal film by vacuum deposition or sputtering,
   (c) a photo-resist is coated on said thin copper film surface, then developed to remove the photo-resist from the portions of the thin copper film which represent conductors of the wiring to expose the copper of these portions,
   (d) an electroplated copper layer is formed on said exposed portions of thin copper film by electroplating,
   (e) a lead layer and a tin layer are formed separately superposed relation by electroplating on said copper layer,
   (f) the residual photo-resist is removed and then said thin copper film and one of the thin chromium film, the thin nichrome film and the thin titanium film underlying the photo-resist is removed by etching,
   (g) said lead layer and said tin layer are subjected to heat treatment at a suitable temperature for converting the lead and tin into an alloy to produce a lead-tin solder.

2. A method in accordance with claim 1, characterized in that the thin metal film selected from group consisting of cromium, nichrome and titanium has a thickness in the range between 500 Å and 2500 Å.

3. A method in accordance with claim 1, characterized in that the thin copper film applied to the thin chromium film has a thickness in the range between 0.2 and 2 μm.

4. A method in accordance with claim 1, characterized in that the copper layer formed on the thin copper film has a thickness in the range between 2 and 20 μm.

5. A method in accordance with claim 1, characterized in that the lead layer has a thickness in the range between 1.2 and 4.8 μm.

6. A method in accordance with claim 1, characterized in that the tin layer has a thickness in the range between 2 and 8 μm.

7. A method in accordance with claim 1, characterized in that the lead layer and tin layer are subjected to heat treatment at a temperature in the range between 100° and 350° C. at which the lead and tin are converted into an alloy to provide a lead-tin solder.

8. A production method for solder coated conductor wiring comprising the following steps (a) through (g);
   (a) a thin chromium film of 0.1 μm thick is formed on a ceramic substrate by vacuum deposition,
   (b) a thin copper film of 0.5 μm thick is formed on said thin chromium film by vacuum deposition,
   (c) a photo-resist is coated on the thin copper film surface, then developed to remove the photo-resist from the portions of the thin copper film which represent conductors of the wiring to expose the copper of these portions,
   (d) an electroplated copper layer of 0.6 μm thick is formed on said exposed portions of the thin copper film by electroplating,
   (e) a lead layer of 2.4 μm thick and the tin layer of 6 μm thick are formed separately superposed relation by electroplating on said copper layer,
   (f) the residual photo-resist is removed and then said thin copper film and said thin chromium film underlying the photo-resist is removed by etching,
   (g) said lead layer and said tin layer are subjected by heating for 10 minutes at 300° C., said lead layer and said tin layer are changed into an alloy to produce a lead-tin solder.

9. A method in accordance with claim 1 or claim 8, characterized in that said portions of the thin copper film which represent conductors of the wiring are spaced less than 20 μm from each other.

10. A method in accordance with claim 7, characterized in that the lead layer and tin layer are subjected to heat treatment at a temperature in the range between 200° and 350° C.

* * * * *